United States Patent
Parry et al.

(10) Patent No.: US 7,973,554 B2
(45) Date of Patent: Jul. 5, 2011

(54) METHOD OF CONFIGURING EMBEDDED APPLICATION-SPECIFIC FUNCTIONAL BLOCKS

(75) Inventors: Stuart Parry, North Somerset (GB); Anthony Stansfield, North Somerset (GB)

(73) Assignee: Panasonic Corporation, Osaka (JP)

( * ) Notice: Subject to any disclaimer, the term of this patent is extended or adjusted under 35 U.S.C. 154(b) by 122 days.

(21) Appl. No.: 12/042,575

(22) Filed: Mar. 5, 2008

(65) Prior Publication Data

US 2008/0218204 A1 Sep. 11, 2008

(30) Foreign Application Priority Data

Mar. 7, 2007 (EP) ..................................... 07103660

(51) Int. Cl.
*H03K 19/173* (2006.01)
(52) U.S. Cl. .................. 326/38; 326/40; 326/41; 326/47
(58) Field of Classification Search .............. 326/37–41, 326/47
See application file for complete search history.

(56) References Cited

U.S. PATENT DOCUMENTS

| | | | | |
|---|---|---|---|---|
| 5,644,251 | A * | 7/1997 | Colwell et al. ................... | 326/16 |
| 6,094,065 | A | 7/2000 | Tavana et al. | |
| 6,172,520 | B1 | 1/2001 | Lawman et al. | |
| 6,195,774 | B1 * | 2/2001 | Jacobson ....................... | 714/727 |
| 6,658,632 | B1 * | 12/2003 | Parulkar et al. ................... | 716/4 |
| 6,799,240 | B1 | 9/2004 | Plants | |
| 7,082,592 | B1 | 7/2006 | Tharmalingam | |
| 7,187,200 | B2 * | 3/2007 | Young ............................. | 326/41 |
| 7,191,342 | B1 * | 3/2007 | New et al. ...................... | 713/190 |
| 7,218,137 | B2 * | 5/2007 | Vadi et al. ......................... | 326/38 |
| 7,348,796 | B2 * | 3/2008 | Crouch et al. .................. | 326/38 |
| 7,362,135 | B1 * | 4/2008 | Chang ............................. | 326/47 |
| 7,414,430 | B2 * | 8/2008 | Vadi et al. ........................ | 326/41 |
| 2003/0077067 | A1 | 4/2003 | Wu et al. | |
| 2003/0122578 | A1 * | 7/2003 | Masui et al. .................... | 326/39 |
| 2004/0119496 | A1 * | 6/2004 | Park et al. ...................... | 326/40 |
| 2005/0198166 | A1 | 9/2005 | Kawaji | |
| 2006/0067102 | A1 * | 3/2006 | Yamada et al. ............... | 365/145 |
| 2006/0186472 | A1 | 8/2006 | Ito | |
| 2008/0024163 | A1 | 1/2008 | Marui | |

FOREIGN PATENT DOCUMENTS

EP 1215586 6/2002

* cited by examiner

*Primary Examiner* — Jason M Crawford
(74) *Attorney, Agent, or Firm* — Greenblum & Bernstein, P.L.C.

(57) ABSTRACT

A method of configuring application-specific functional blocks embedded in a user programmable fabric, the user programmable fabric comprising configuration data control means having an input and an output and the application-specific functional blocks comprising configuration memory means having an input and an output. The method comprises the steps of sending configuration data to configure the application-specific functional block to the configuration control means of the user programmable fabric, routing the output of the configuration data control means of the user programmable fabric to the input of the configuration memory means of the application-specific functional blocks, transferring the configuration data to the configuration memory means of the application-specific functional blocks and configuring, using the configuration data, the application-specific functional blocks.

14 Claims, 11 Drawing Sheets

METHOD OF CONFIGURING EMBEDDED APPLICATION-SPECIFIC FUNCTIONAL BLOCKS

The present invention relates to the field of user programmable logic devices. More specifically, the present invention is directed to a method of configuring application-specific functional blocks which are embedded in a user programmable fabric.

Reconfigurable devices/fabrics are commonly constructed from multiple instances of a single user programmable logic block or tile, the fundamental building block of the system. This arrangement facilitates the use of an easily scalable configuration mechanism of equally regular structure.

The insertion of application-specific functional blocks embedded within the reconfigurable device/fabric is often used to enhance the performance of the device/fabric within specific application contexts. The addition of these application-specific functional blocks complicates the reconfiguration scheme requiring modification to the configuration mechanism and the interface it provides.

In order to provide a solution to the above problems, prior art devices have been developed which have fixed-functionality application-specific functional blocks. Fixing the functionality of these blocks removes the need to provide any form of configuration mechanism. However, although this solution requires no extra configuration by the user to initialise the embedded application functional blocks, it also reduces the flexibility and re-usability of the re-configurable device/fabric.

Another solution which has been put forth in prior art devices is the provision of a separate dedicated configuration mechanism for the embedded application-specific functional blocks. This solution requires an additional, separate and sometimes significantly different, interface to be provided by the re-configuration device/fabric. Moreover, this solution has the added disadvantage of requiring a separate configuration protocol within the configuration control block in order to perform the configuration of the embedded application-specific functional blocks. Accordingly, the extra logic required to create the extra, dedicated configuration path incurs extra design and manufacturing costs.

In order to alleviate the need for extra, dedicated configuration logic, another solution has been developed which sees the user programmable section of the device/fabric reconfigured to act in full or in part as a configuration mechanism for the embedded application-specific functional blocks. Then, once the embedded application-specific functional blocks are configured, the user programmable section is re-configured as required by the application. Although this solution solves the problem of having to add dedicated configuration circuitry, it also comes with an inherent configuration time penalty, as it requires the user programmable logic to be re-configured twice each time an application is to be programmed onto the array.

Other prior art systems allow a refinement of the above solution by providing the user programmable section of the device/fabric with a default configuration that would provide, in full or in part, a configuration mechanism for the embedded application-specific functional blocks. Once the embedded application-specific functional blocks are configured, the user programmable section is then re-configured as required by the application. Although the default configuration may be activated from within the re-configurable device/fabric (on power-up as a default state or in response to external control) this solution also requires, in effect, a double configuration of the user programmable logic.

Thus, there exists a clear need for an improved flexible method of configuring embedded application-specific functional blocks without adding to the complexity of existing circuitry.

In order to solve the problems associated with the prior art, the present invention provides a method of configuring application-specific functional blocks embedded in a user programmable fabric, the user programmable fabric comprising configuration data control means having an input and an output and the application-specific functional blocks comprising configuration memory means having an input and an output, the method comprises the steps of:

sending configuration data to configure the application-specific functional block to the configuration control means of the user programmable fabric;

routing the output of the configuration data control means of the user programmable fabric to the input of the configuration memory means of the application-specific functional blocks;

transferring the configuration data to the configuration memory means of the application-specific functional blocks; and configuring, using the configuration data, the application-specific functional blocks.

Preferably, the configuration control means comprises a chain of registers and wherein the step of sending configuration data to configure the application-specific functional block further comprises the step of:

shifting the configuration data to configure the application-specific functional block through the chain of registers.

Preferably, the step of routing the output of the configuration data control means comprises the step of:

enabling the input of the configuration memory means of the application-specific functional blocks.

Preferably, the above method further comprises the steps of:

routing the output of the configuration memory means to the input of the configuration data control means;

transferring the configuration data to the configuration data control means; and reading the configuration data.

Preferably, the configuration control means comprises a chain of registers and wherein the step of reading the configuration data further comprises the step of:

shifting the configuration data through the chain of registers.

Preferably, the step of routing the output of the configuration memory means further comprises the step of:

enabling the output of the configuration memory means of the application-specific functional blocks.

The present invention further provides an apparatus for configuring application-specific functional blocks embedded in a user programmable fabric, the user programmable fabric comprising configuration data control means having an output and the application-specific functional blocks comprising configuration memory means having an input, the apparatus comprises:

sending means arranged to send configuration data to configure the application-specific functional blocks to the configuration control means of the user programmable fabric;

routing means arranged to route the output of the configuration data control means of the user programmable fabric to the input of the configuration memory means of the application-specific functional blocks;

transferring means arranged to transfer the configuration data to the configuration memory means of the application-specific functional blocks; and configuration means arranged to configure, using the configuration data, the application-specific functional blocks.

Preferably, the configuration control means comprises a chain of registers and wherein the sending means further comprises:

shifting means for shifting the configuration data to configure the application-specific functional block through the chain of registers.

Preferably, the routing means further comprises:

enabling means for enabling the input of the configuration memory means of the application-specific functional blocks.

Preferably, the apparatus further comprises:

routing means for routing the output of the configuration memory means to the input of the configuration data control means;

transferring means for transferring the configuration data to the configuration data control means; and reading means for reading the configuration data.

Preferably, the configuration control means comprises a chain of registers (401) and wherein reading means further comprises:

shifting means for shifting the configuration data through the chain of registers.

Preferably, the routing means further comprises:

enabling means for enabling the output of the configuration memory means of the application-specific functional blocks.

As will be appreciated, the present invention provides several advantages. For example, the present invention does not require any pre-configuration of the user programmable logic available. Also, the present invention provides the advantage of supporting both configurable and re-configurable embedded application-specific functional blocks and configurable and re-configurable user programmable logic blocks. Moreover, the present invention provides the same interface and protocol to the configuration controller irrespective of the existence, number, position or specific function of any of the embedded application-specific functional blocks.

An example of the present invention will now be described with reference to the accompanying drawings, in which.

Figure 1:
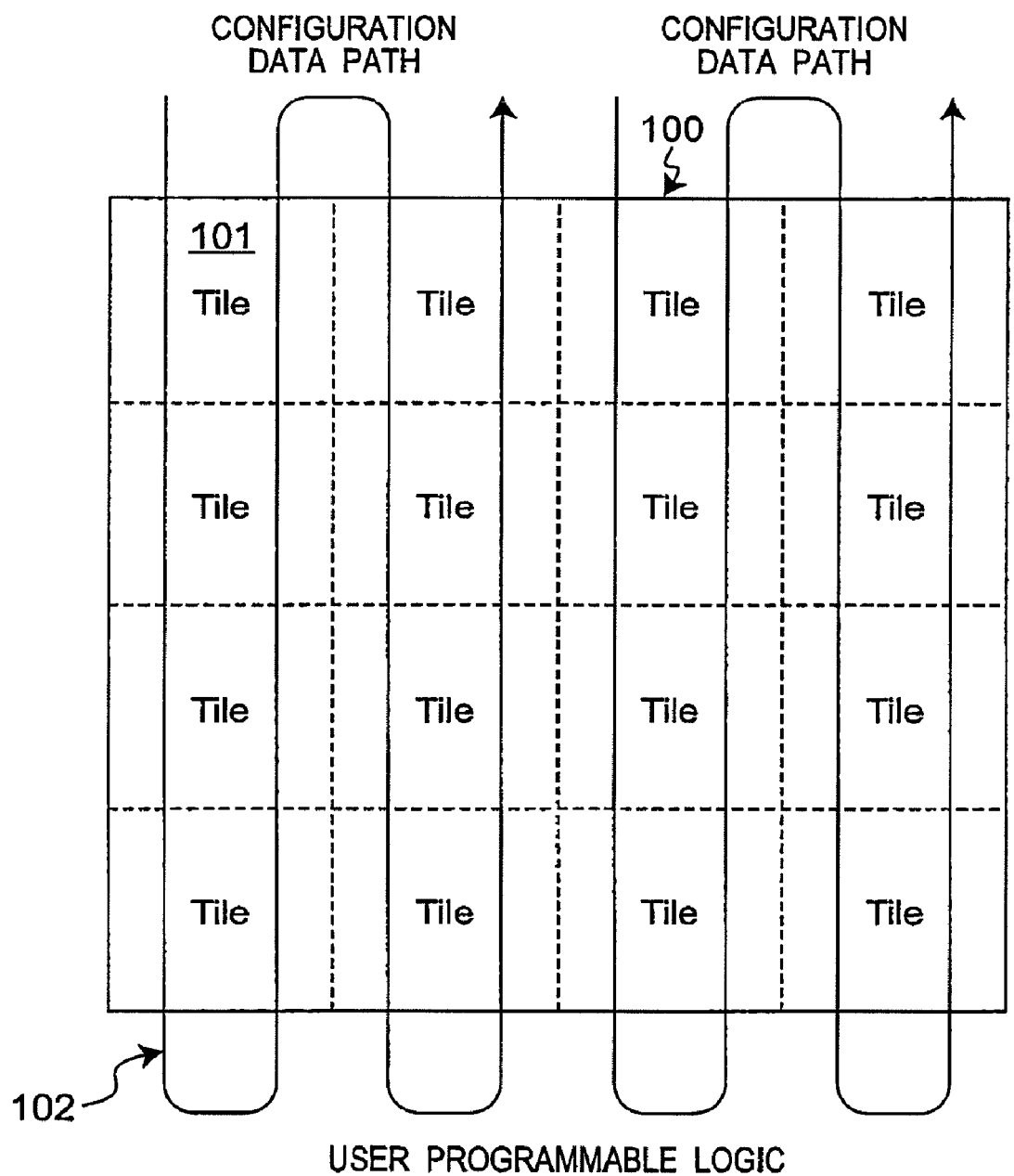
FIG. 1 shows a diagram representing a programmable logic device in accordance with the prior art.

FIG. 1 shows a diagram representing a programmable logic device 100 which is made of a plurality of tiles 101. Each tile 101 contains a plurality of configuration registers (not shown) which are linked by a configuration data path 102.

Figure 2:
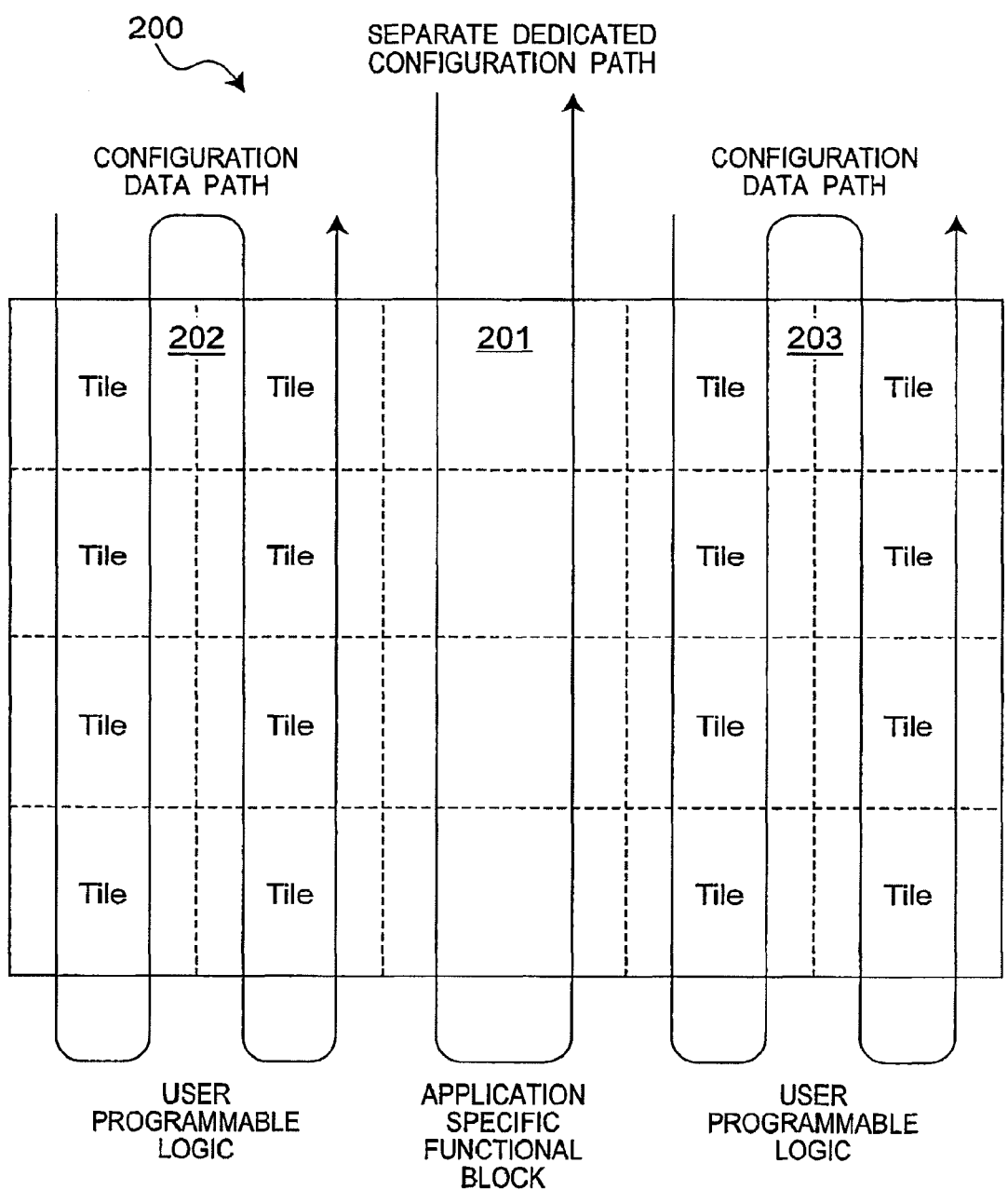
FIG. 2 shows a diagram representing a programmable logic device comprising an embedded application-specific functional block in accordance with the prior art.

FIG. 2 shows a diagram representing a device 200 according to the prior art. The centre portion of the diagram represents an application-specific functional block 201. On either side of the application-specific functional block 201 are sections of user programmable logic 202, 203. Each section of user programmable logic 202, 203 is made up of an array of tiles, as is the case in the device of FIG. 1. As can be seen from FIG. 2, the configuration data path of the programmable logic sections 202, 203 are completely separate from the configuration path of the application-specific functional block 201. This dedicated configuration path adds to the overall complexity of the device 200.

Figure 3:
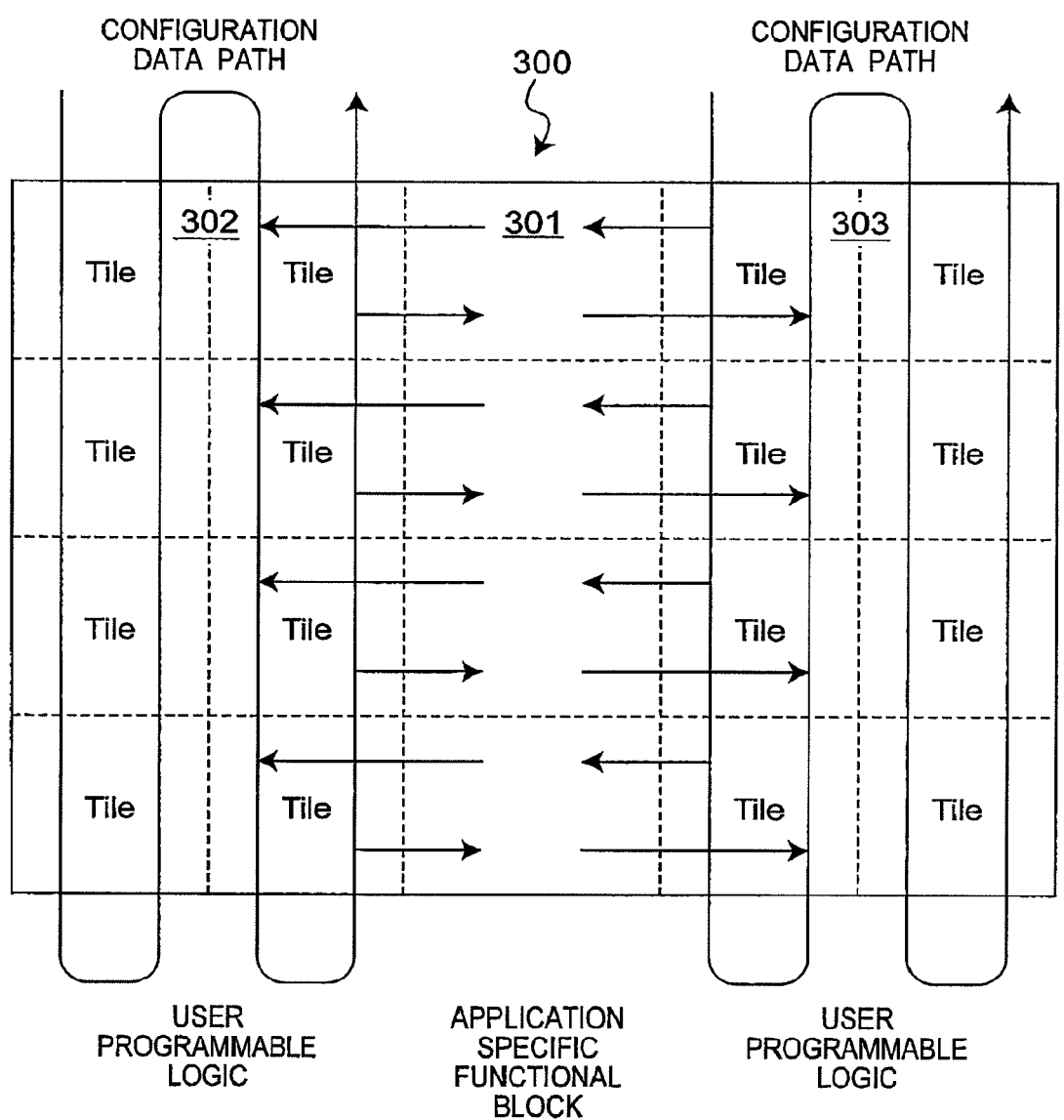
FIG. 3 shows a diagram representing a programmable logic device in accordance with the present invention.

FIG. 3 shows a device 300 in accordance with one example of the present invention. Again, the centre portion of the diagram represents an application-specific functional block 301 and, on either side of the block 301 are user programmable logic blocks 302, 303. However, although the user programmable logic blocks 302, 303 each have their own configuration data paths, the application-specific functional block 301 is configured using the programmable logic block data paths.

In order to configure and re-configure an embedded application-specific functional block within a re-configurable device/fabric, the existing configuration mechanism used for the user programmable logic section is reused in a different way. This provides a common interface to both which is independent of the number, location or type of embedded application-specific functional blocks.

Figure 4:
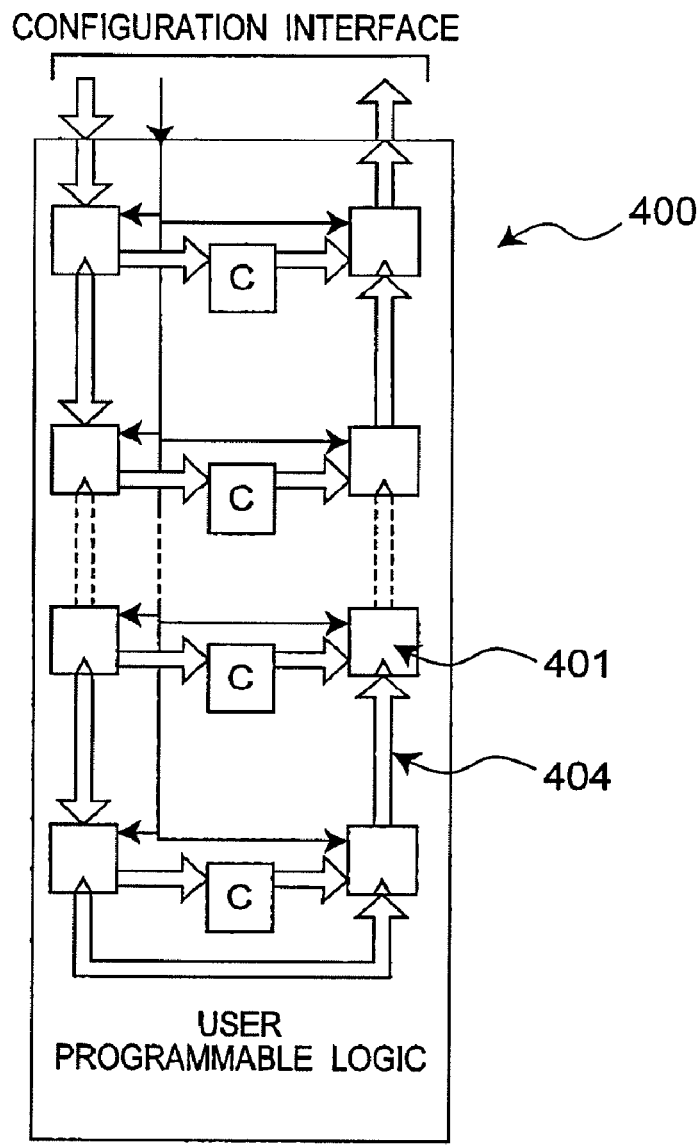
FIG. 4 shows a diagram representing the configuration chain of a device according to the present invention.

Thus, in order to better describe the invention, a detailed account of the configuration of a user programmable logic block of a system in accordance with the present invention will now be described. FIG. 4 shows a user programmable logic block 400 comprising internal registers 401 which are chained together using either dedicated configuration wires or wires which form part of the general routing network of the re-configurable device/fabric. In operation, configuration data is shifted along the chains 404 until each register 401 on the chain contains data. This occurs under the control of configuration control signals which may also be fed into the device/fabric via chains of internal registers. However, it is likely that all registers on a particular chain will be addressed/accessed in the same way at any given time so control data may be distributed via semi-global non-registered signals to all stages of the configuration data chain. The control information is then decoded at each stage to perform read/write/shift operations on the data in the configuration chains and related configuration cells 401 within the programmable logic blocks.

Figure 5:
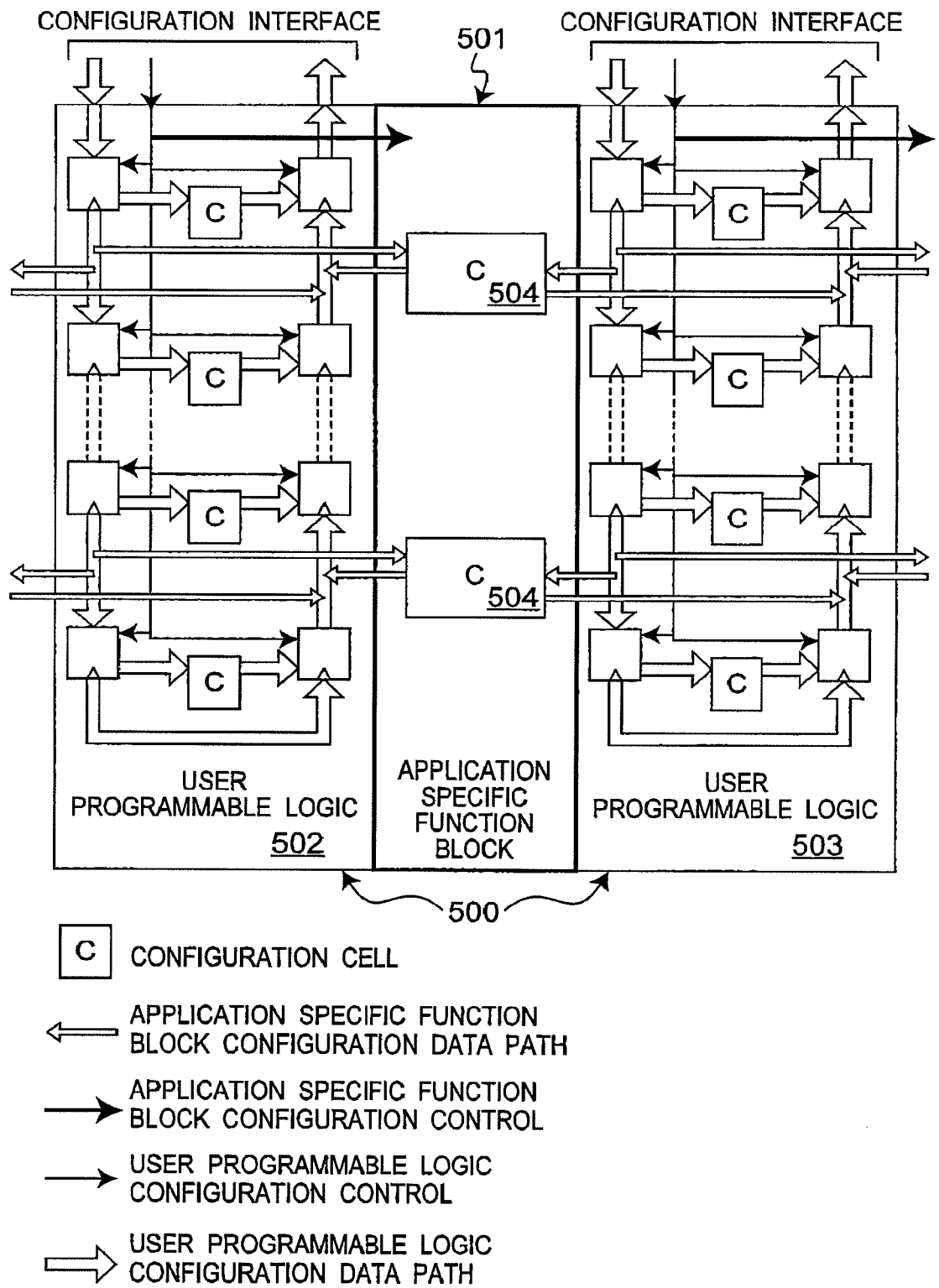
FIG. 5 shows a diagram representing the configuration chain of a device in accordance with the present invention.

Now, with reference to FIG. 5, a method in accordance with the present invention will now be described. In order to configure the embedded application-specific functional blocks 501 within the re-configurable device/fabric 500, the inputs and outputs of the configuration cells 504 of the application-specific functional block 501 are connected via existing routing paths to the configuration chains within the user programmable logic blocks 502, 503. In addition, the control signals of the user programmable logic blocks 502, 503 are also decoded in order to be provided to any application-specific functional blocks which may occupy an adjacent position within the re-configurable device/fabric. This will be used as an enabling signal to enable the application-specific functional block operation signal. When this signal is asserted, the application-specific functional block will perform the operation requested by the remaining configuration interface signals.

If there is no adjacent application-specific functional block, then the additional control outputs and the existing configuration data paths that would have been used by the missing application-specific functional block will instead be connected into the adjacent user programmable logic block. If this is the case, the neighbouring block will ignore any configuration data on the existing routing network driven by its immediate neighbour while the device/fabric is in configuration mode. The additional control output supplied by the blocks of user programmable logic may or may not be used to facilitate more advanced configuration options.

The configuration interface provided by the application-specific functional blocks contain the following input and output signals:

| | |
|---|---|
| Data Input | Data written into configuration/data memory within the application-specific functional block. |
| Data Output | Data read from the configuration/data memory within the application specific functional block. |
| Address | Address of the data to be accessed with the application-specific functional block. |
| Command | A command to instruct the application-specific functional block how to interpret and respond to the Data Input, Data Output and Address signals (perform a read/write/No operation). |
| Enable | A control signal to initiate configuration operations on application-specific functional blocks (may be viewed as a 'Valid' signal for the Command input). |

The configuration of embedded application-specific functional blocks is achieved by the following method. First, data consisting of the configuration data to be written, the address to be written to and a "WRITE" command, is shifted into the configuration chains within the adjacent user programmable logic blocks 502, 503 using a series of shift operations.

Then, an "application-specific functional block operation" is performed on the configuration chains in order to "validate" the command which has been shifted into the configuration chain. This will instruct the application-specific functional block 501 to decode the command, perform the required operation and update its outputs as required.

The above steps are then repeated until the application-specific functional block is fully configured. During this configuration process, the user programmable logic blocks 502, 503 may or may not have been configured. If data is to be read out of the application-specific functional blocks 501 then the data shifted out during each subsequent chain shift operation should be captured as new data being shifted into the chain.

When configuring application-specific functional blocks 501, configuration chains located within user programmable logic blocks 502, 503 on both sides may need to be accessed together in a synchronised manner depending on the configuration chain topology. Also, data written into an application-specific functional block 501 may come from a configuration chain within a user programmable logic block 502 on one side of application-specific functional block 501 but when the same data is to be read, it may be that it is done via a configuration chain within a user programmable logic block 503 on the opposite side.

Figure 6:
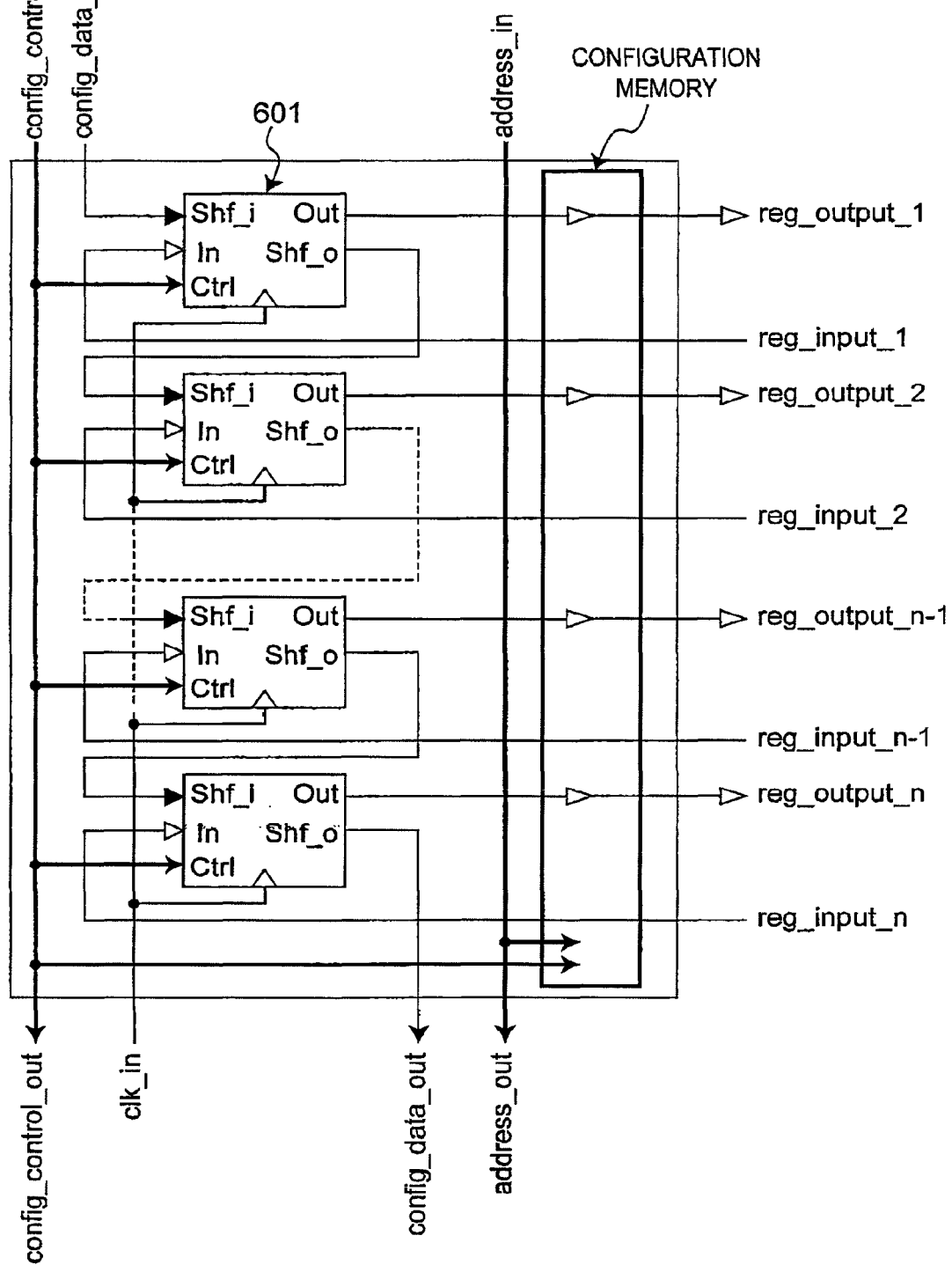
FIG. 6 shows a detailed diagram representing the configuration chain of FIG. 4.
Figure 7:
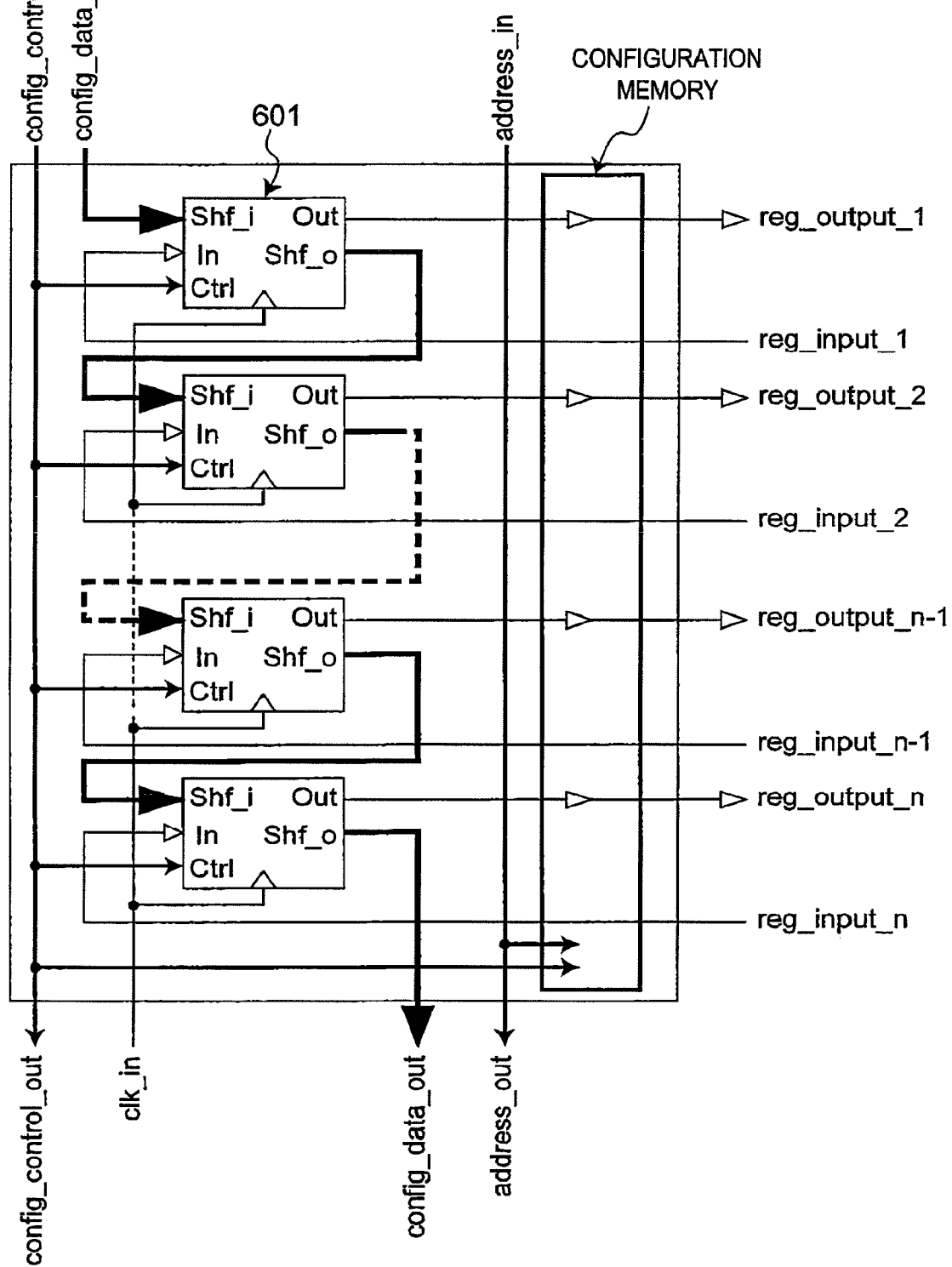
FIG. 7 shows a diagram representing the configuration chain of FIG. 6 during a SHIFT operation.
Figure 8:
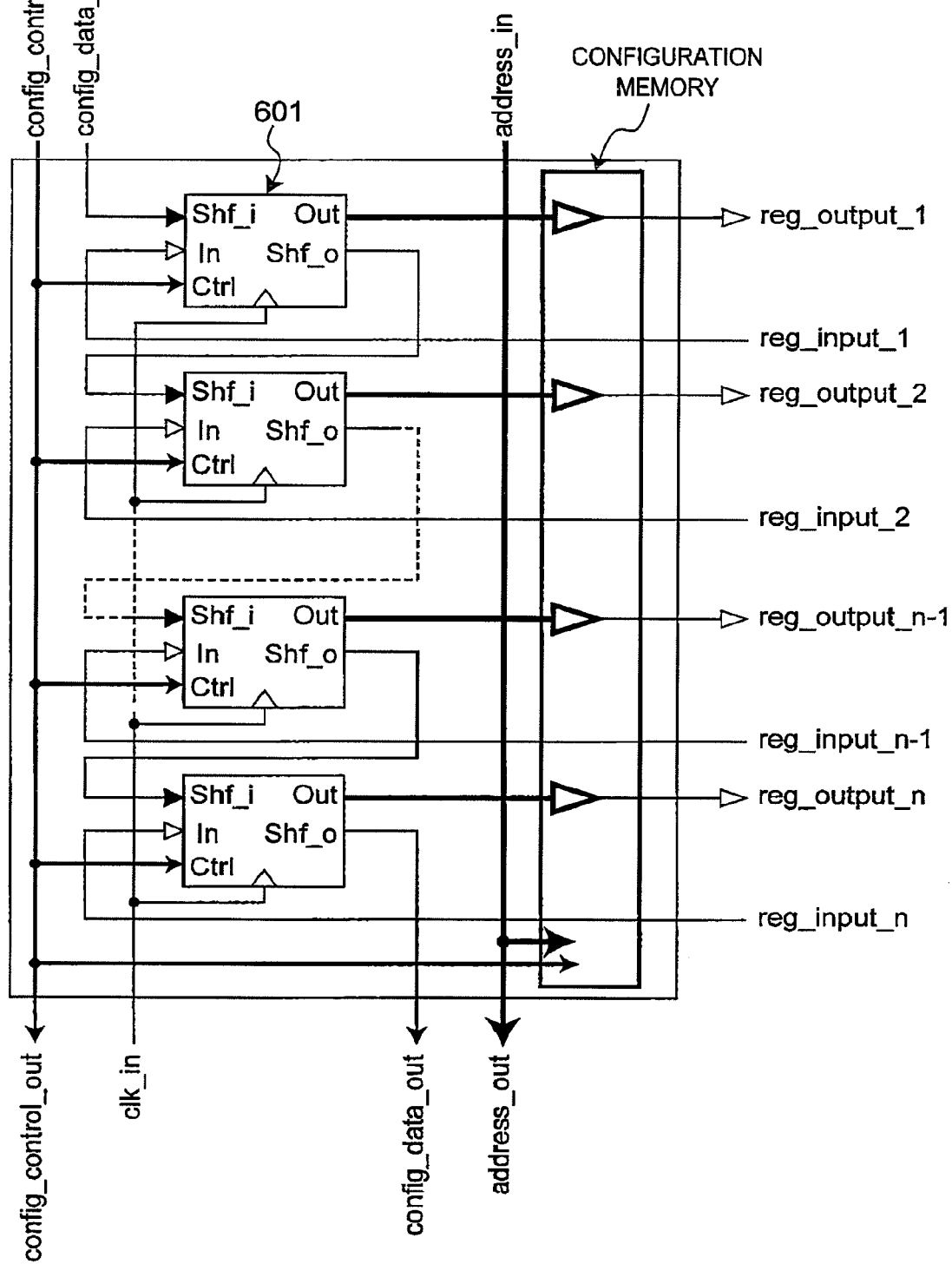
FIG. 8 shows a diagram representing the configuration chain of FIG. 6 during a WRITE operation.

Now, with reference to FIG. 6 to 8, a more detailed example of the present invention will now be described. The number of configuration chains within the entire user programmable logic section of the fabric will vary depending on the particular architecture (e.g. the width of the registers, the relative positions within a chain of the registers and the length of each chain). FIG. 6 shows an example of a configuration chain containing n registers. The inputs and outputs of such a block may be connected to preceding and subsequent blocks to created longer chains, as desired.

As shown in FIG. 6, this particular configuration chain is formed by a series of register cells 601. Each cell accepts inputs from two sources and outputs its current state to two separate outputs. Active inputs are selectable via the control input. Additionally each register cell 601 may retain its present state and ignore both input values. This type of register cell may be a specially designed flip-flop or a combination of a register and sequential logic.

The above chain structure then allows a number of operations to be performed in response to a specific value of the control input, examples of which are shown in the following table.

| | |
|---|---|
| NOP | Perform "no operation". Each register retains its current state. The register Ctrl input is asserted such that neither input is active. |
| SHIFT | Data is shifted along each chain, each register passes its current value to the next register in the chain. The register Ctrl input is asserted such that the input connected to the previous register in the chain is active. |
| READ | Data from within the user programmable logic blocks (register data, memory data, configuration data etc) is loaded into the configuration chain. The register Ctrl input is asserted such that the input driven from the user programmable logic block (memory, register, configuration cell etc) is active. |
| WRITE | Data within each configuration register is copied to a location (register, memory, configuration cell etc) within the user programmable logic blocks. The Address is internally decoded and enables the inputs to the addressed target destination (register, memory, configuration cell etc). |

Using only the above operations, it is possible to program the user configurable logic blocks. In this specific example, this is achieved by performing the following sequence of operations.

First, the address of the required configuration cell 601 location must be asserted to the address inputs. This is done at the beginning of the sequence to allow the address to propagate over the long distances of the fabric (the address bus is not registered in this example but may be in other architectures).

Secondly, the required data is shifted into the configuration chain(s) using the SHIFT operation. As shown in FIG. 7, during SHIFT operations, it is the register cells than are sensitive to the Configuration Control input ("config_control_in"). The active data path is in bold in FIG. 7. Then, the above is repeated until the entire configuration chain contains valid configuration data. Then one or more NOP operations are performed in order to allow the data outputs of each register 601 on the configuration chain to propagate through the user programmable logic block. This last operation is a precautionary measure and may not be required.

The next step consists of performing a WRITE function using the data contained within the configuration chain registers 601. As shown in FIG. 8, during the WRITE operation it is the Configuration Memory (registers, memory, configuration cell etc) that is sensitive to the Configuration Control input ("config_control_in") enabling the decoded Address to activate the inputs to the addressed location. Again, the active data path is in bold in FIG. 8. The data is written into the addressed configuration memory locations within each block. The above steps are then repeated until all configuration memory locations have been written.

Now, again with reference to FIG. 6, the method of reading the configuration memory of each user programmable logic block will now be described.

The first step in this method is to assert the address of the required configuration cell location to the Address inputs. Then, one or more NOP operations are performed in order to allow the address to propagate over the long distances of the fabric. Again, although, in this example the address bus is not registered, it may be in other architectures.

The next step in the method is reading the data at the addressed configuration memory location within each block into the registers 601 on the configuration chain. This is done using the READ operation.

Then, the read data is shifted along the configuration chain, each data word emerging from the end (output) of the chain being stored. This is done using the SHIFT operation. This SHIFT operation is repeated until all read data has been output from the chain. The steps of the above method are then repeated until all configuration locations have been read.

Now, with reference to FIGS. 9 to 11, the method of configuring the embedded application functional blocks according to one embodiment of the present invention will now be described.

Figure 9:
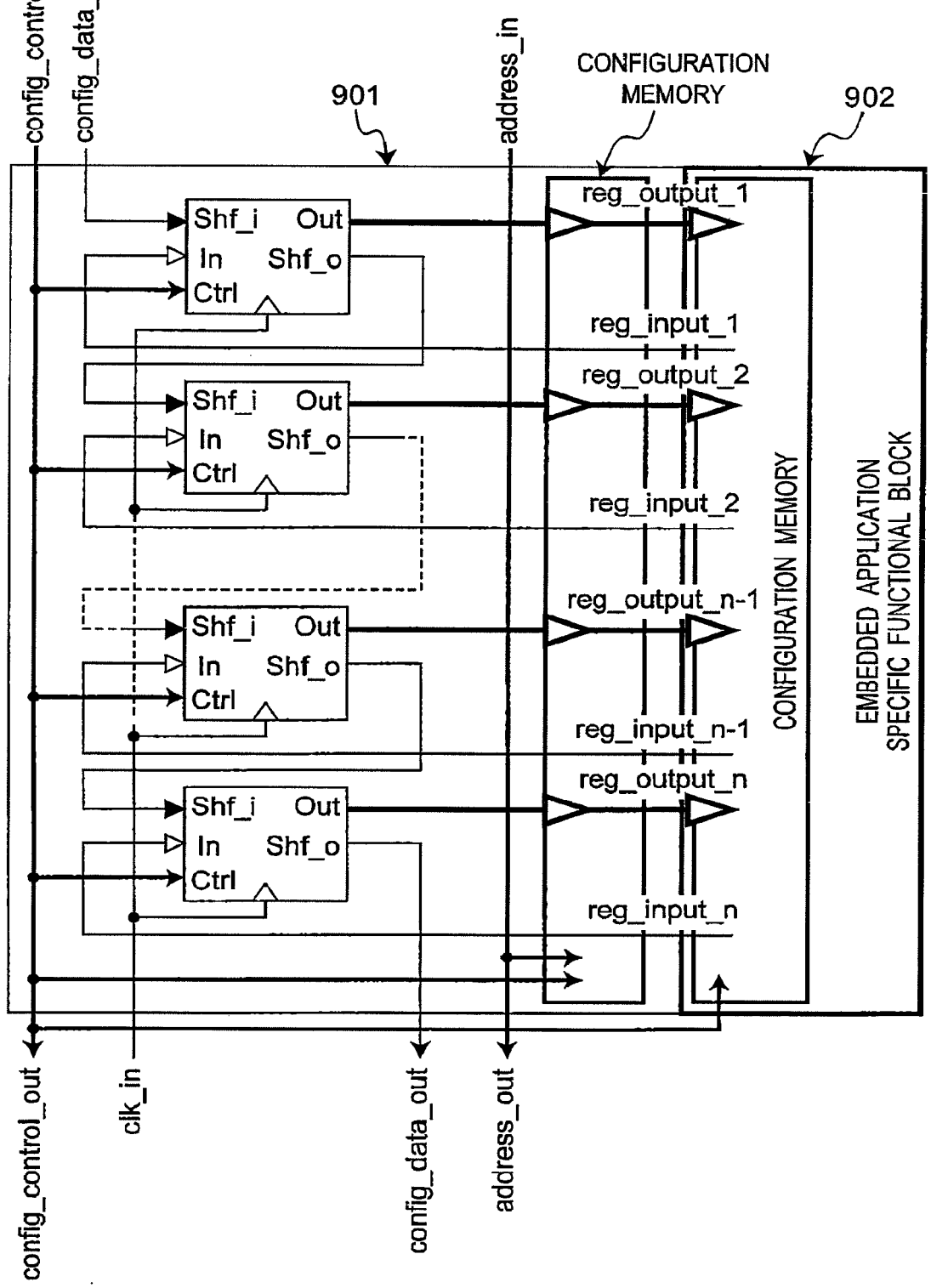
FIG. 9 shows a diagram of a configuration chain in accordance with the present invention.

FIG. 9 shows how the user programmable logic blocks 901 interact with embedded application-specific functional blocks 902 by way of their existing configuration chains. Existing wires in the routing network between the two blocks used for run time communication are again reused during configuration. This means that instead of supplying each embedded application-specific functional block 902 with its own configuration interface (configuration chains, address bus and control input) the existing configuration circuitry within the user programmable logic blocks 901 is used as a transport mechanism for the configuration data/control required to configure the embedded application-specific functional blocks.

This produces an indirect configuration scheme where all control/data required to configure the embedded application functional blocks 902 is treated as configuration data by the configuration mechanism and then transferred to the embedded functional blocks by existing data paths. It is then down to the embedded functional block 902 itself to correctly interpret the control and data correctly while in configuration mode.

Figure 10:
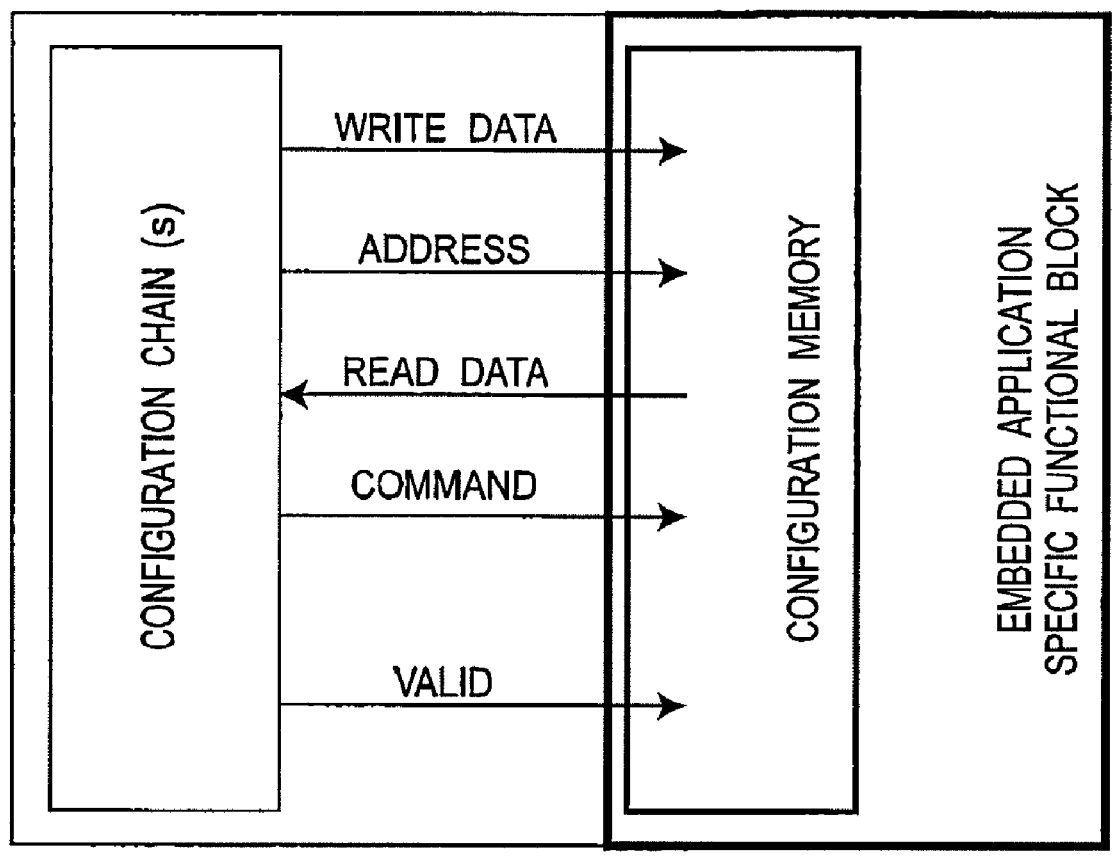
FIG. 10 shows a diagram representing the desired effective functionality of a device in accordance with the present invention.
Figure 11:
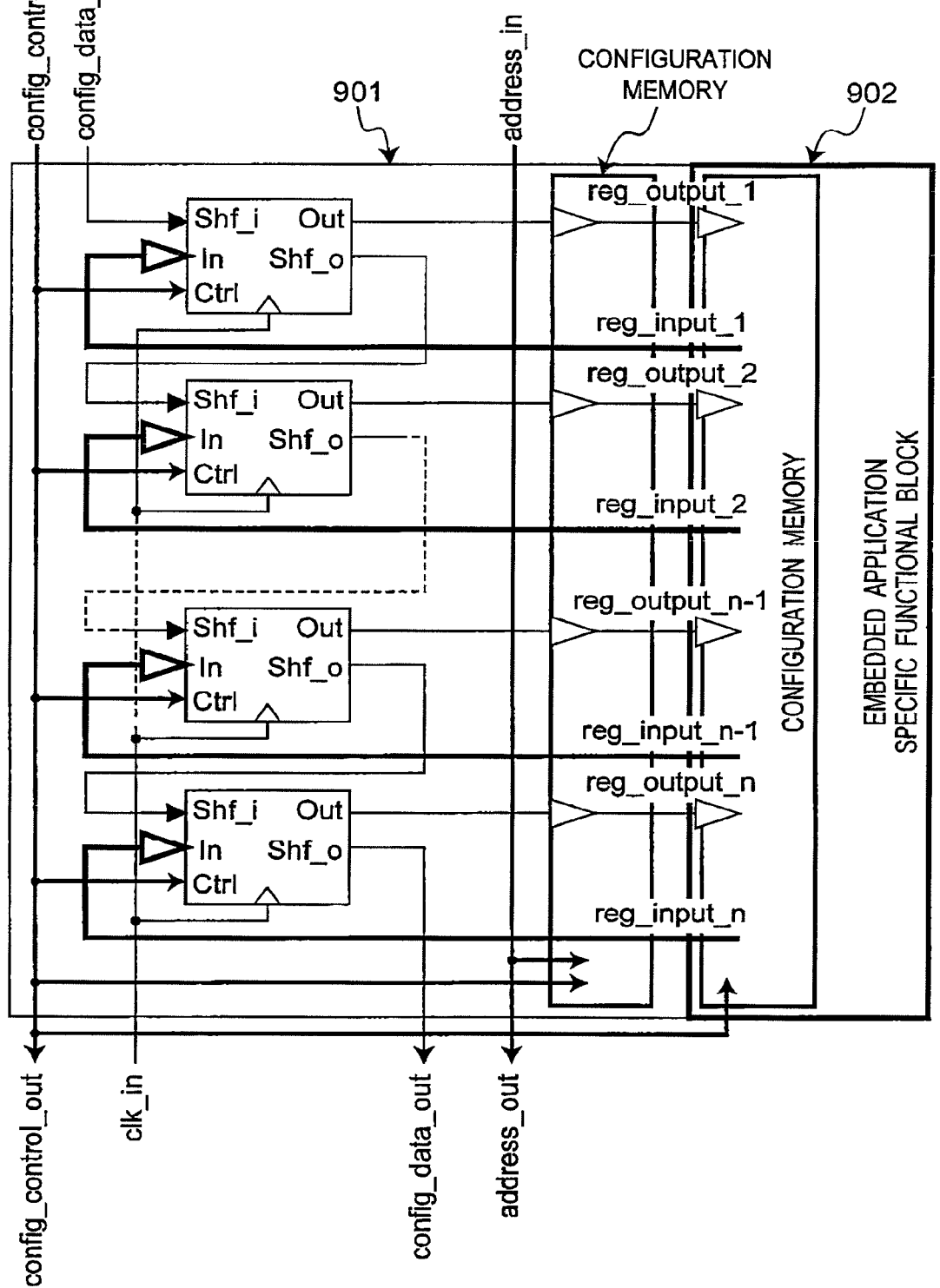
FIG. 11 shows a diagram representing the configuration chain of FIG. 9 during a READ operation.

Thus, "reg_input_x" and "reg_output_x" signals are mapped to the inputs and outputs shown In FIG. 10. The number of registers available in the user programmable logic blocks and their width must be sufficient to supply enough data/address/command bits to each embedded block, the details of which are implementation and architecture specific.

In order for the data on the signals shown in FIG. 10 to be interpreted at the correct time, additional values (operations) for the Configuration Control Input ("config_control_in") of the user programmable logic blocks are required in order to signal that access to the embedded functional blocks will occur. For example, an EMBEDDED_ACCESS operation should be defined.

In addition, the Configuration Control Output signal "config_control_output" from each user programmable logic block must also be input to each application-specific embedded functional block as well as being input to the next programmable logic block. During an EMBEDDED_ACCESS operation, only the embedded application-specific functional block is sensitive to the Configuration Control signal.

As shown in FIG. 10 the following signals are required (their width being architecture and implementation specific).

| | |
|---|---|
| Write Data | Configuration data to be written into the embedded functional blocks configuration memory (register, memory, configuration cell etc) at the location indicated by 'Address'. |
| Read Data | Configuration data to be read from the configuration memory within the (register, memory, configuration cell etc) embedded functional blocks from the address indicated by 'Address'. |
| Address | Indicates which memory location is to be accessed during the current operation. |
| Command | Defines the configuration operation to be performed on the embedded functional blocks. The following are examples of the essential commands: EB_NOP - No operation, this is useful as multiple embedded functional blocks may be configured from the same configuration chain. But not all may require configuration for a given application. EB_WRITE - The 'Write Data' presented to the embedded functional block should be written to 'Address'. EB_READ - The data currently at 'Address' should be read and placed on 'Read Data'. |
| Valid | This signal is driven by the Configuration Control (when asserted to EMBEDDED_ACCESS) within the user programmable logic block. When asserted, the embedded functional block will become sensitive to its inputs and perform a configuration operation as defined by 'Command'. |

In this example of the present invention, the method for configuring an embedded application-specific functional block 902 have the following steps.

First, using the SHIFT operation, control, address and configuration data is shifted into the associated configuration chain(s) in order for the application-specific functional blocks 902 to be written by the chains. In this example, the address of the memory location, the data to be written and the command to be performed, EB_WRITE are shifted from one register to the other. This last step is repeated until all the required configuration and control data has been shifted into the chain.

Then, one or more NOP operations are performed to allow the data outputs of each register on the configuration chain to propagate through the user programmable logic block. Again, this is a precautionary measure and may not be required in other examples of the present invention.

The next step in the method is to perform an EMBEDDED_ACCESS operation on the configuration chain triggering the application-specific functional blocks 902 to enable their inputs and therefore, in this instance, perform the required EB_WRITE operation. Then, one or more NOP operations are performed in order to allow the embedded application-specific functional blocks 902 to complete the current operation (EB_WRITE). Finally, the above steps are repeated for each address locations within the application-specific embedded blocks 902.

Now, the method of reading configuration data back from the application-specific embedded blocks will now be described.

First, a SHIFT operation is performed in order to shift the required control, address and configuration data into the associated configuration chain(s) for the application-specific functional blocks 902 to be read by the chain(s). In this case the address of the memory location, the data to be read and the command to be performed, EB_READ. This step is repeated until all the required configuration and control data has been shifted into the chain.

Then, one or more NOP operations are performed in order to allow the data outputs of each register on the configuration chain to propagate through the user programmable logic block. Again, this is merely a precautionary measure.

An EMBEDDED_ACCESS operation is then performed on the configuration chain triggering the application-specific functional blocks 902 to enable their inputs, and therefore perform the required operation, a EB_READ in this instance.

Then, one or more NOP operations are performed in order to allow the embedded application-specific functional blocks 902 to complete the current operation (EB_READ) and present the read data on their outputs.

Once this is done, an UPDATE_CHAIN operation on the configuration chain is performed. This is similar to a READ operation described earlier but data from the embedded functional block is routed to the register inputs on the configuration chain, as shown in by the bold data lines in FIG. 11.

Then, the configuration chain is shifted using the SHIFT operation and the output data words are stored. This step is repeated until all data is read from the configuration chain(s). Finally, the steps of the above method are repeated for every address locations within the application-specific embedded blocks.

The invention claimed is:

1. A method of configuring application-specific functional blocks embedded in a user programmable fabric, the user programmable fabric including a configuration data controller having an input and an output, the application-specific functional blocks comprising a first configuration memory having an input and an output, and a plurality of user programmable logic blocks comprising a register and a second configuration memory having an input and an output, the method comprising:
    sending configuration data to configure the application-specific functional blocks to the configuration data controller of the user programmable fabric;
    routing the output of the configuration data controller of the user programmable fabric to the input of the first configuration memory of the application-specific functional blocks via the plurality of user programmable logic blocks;
    transferring the configuration data to a register of the plurality of user programmable logic blocks;
    transferring the configuration data from the register of the plurality of user programmable logic blocks to the first configuration memory of the application-specific functional blocks; and
    configuring, using the configuration data, the application-specific functional blocks.

2. The method of claim 1, wherein the configuration data controller comprises a chain of registers and wherein sending configuration data to configure the application-specific functional blocks further comprises:
    shifting the configuration data to configure the application-specific functional blocks through the chain of registers.

3. The method of claim 1, wherein routing the output of the configuration data controller comprises:
    enabling the input of the first configuration memory of the application-specific functional blocks.

4. The method of claim 1, further comprising:
    routing the output of the first configuration memory to the input of the configuration data controller;
    transferring the configuration data to the configuration data controller; and
    reading the configuration data.

5. The method of claim 4, wherein the configuration data controller comprises a chain of registers and wherein reading the configuration data further comprises:
    shifting the configuration data through the chain of registers.

6. The method of claim 4, wherein routing the output of the first configuration memory further comprises:
    enabling the output of the first configuration memory of the application-specific functional blocks.

7. The method according to claim 1,
    wherein application functionality of the application-specific functional blocks is determined by a manufacturer and not a user.

8. An apparatus for configuring application-specific functional blocks embedded in a user programmable fabric, the user programmable fabric including a configuration data controller having an output, the application-specific functional blocks comprising a first configuration memory having an input, and a plurality of user programmable logic blocks comprising a register and a second configuration memory having an input and an output, the apparatus comprising:
    a sender arranged to send configuration data to configure the application-specific functional blocks to the configuration data controller of the user programmable fabric;
    a router arranged to route the output of the configuration data controller of the user programmable fabric to the input of the first configuration memory of the application-specific functional blocks via the plurality of user programmable logic blocks;
    a transferrer arranged to transfer the configuration data to a register of the plurality of user programmable logic blocks, and to transfer the configuration data from the register of the plurality of user programmable logic blocks to the first configuration memory of the application-specific functional blocks; and
    a configurer arranged to configure, using the configuration data, the application-specific functional blocks.

9. The apparatus of claim 8, wherein the configuration data controller comprises a chain of registers and wherein the sender further comprises:
    a shifter arranged to shift the configuration data to configure the application-specific functional blocks through the chain of registers.

10. The apparatus of claim 8, wherein the router further comprises:
    an enabler arranged to enable the input of the first configuration memory of the application-specific functional blocks.

11. The apparatus of claim 8, further comprising:
    a second router arranged to route an output of the first configuration memory to an input of the configuration data controller;
    a second transferrer arranged to transfer the configuration data to the configuration data controller; and
    a reader arranged to read the configuration data.

12. The apparatus of claim 11, wherein the configuration data controller comprises a chain of registers and wherein the reader further comprises:
    a shifter arranged to shift the configuration data through the chain of registers.

13. The apparatus of claim 11, wherein the second router further comprises:
    an enabler arranged to enable the output of the first configuration memory of the application-specific functional blocks.

14. The apparatus according to claim 8,
    wherein application functionality of the application-specific functional blocks is determined by a manufacturer and not a user.

* * * * *